United States Patent
Katoh et al.

(10) Patent No.: US 7,808,769 B2
(45) Date of Patent: Oct. 5, 2010

(54) DIELECTRIC DEVICE AND METHOD OF MANUFACTURING THE SAME

(75) Inventors: Tomohiko Katoh, Tokyo (JP); Kenji Horino, Tokyo (JP); Yuko Saya, Tokyo (JP)

(73) Assignee: TDK Corporation, Tokyo (JP)

( * ) Notice: Subject to any disclaimer, the term of this patent is extended or adjusted under 35 U.S.C. 154(b) by 817 days.

(21) Appl. No.: 11/637,709

(22) Filed: Dec. 13, 2006

(65) Prior Publication Data

US 2007/0138128 A1    Jun. 21, 2007

(30) Foreign Application Priority Data

Dec. 20, 2005   (JP)   ............ P2005-366715
Nov. 15, 2006   (JP)   ............ P2006-309590

(51) Int. Cl.
*H01G 4/008*   (2006.01)

(52) U.S. Cl. .......... 361/305; 361/311; 361/312; 361/313; 361/321.1; 361/321.2

(58) Field of Classification Search ......... 361/311–313, 361/321.1, 321.2, 301.4, 303–305, 321.5, 361/301.3, 306.1
See application file for complete search history.

(56) References Cited

U.S. PATENT DOCUMENTS

| | | | |
|---|---|---|---|
| 5,088,002 A | | 2/1992 | Ogawa |
| 5,406,447 A | * | 4/1995 | Miyazaki ............ 361/313 |
| 5,502,326 A | * | 3/1996 | Slotboom et al. ........ 257/530 |
| 5,587,870 A | * | 12/1996 | Anderson et al. ........ 361/313 |
| 5,645,976 A | | 7/1997 | Azuma |
| 6,498,714 B1 | | 12/2002 | Fujisawa et al. |
| 6,503,609 B1 | | 1/2003 | Löbl et al. |
| 6,700,771 B2 | * | 3/2004 | Bhattacharyya ........ 361/311 |
| 6,882,516 B2 | * | 4/2005 | Baniecki et al. ........ 361/321.1 |
| 6,912,113 B2 | * | 6/2005 | Kumar et al. ........ 361/301.4 |
| 7,157,337 B2 | * | 1/2007 | Lander et al. ........ 438/275 |

FOREIGN PATENT DOCUMENTS

| | | |
|---|---|---|
| DE | 1 022 957 | 1/1958 |
| EP | 1 022 769 A2 | 7/2000 |
| JP | 2000-164460 A | 6/2000 |
| JP | 2001-203455 A | 7/2001 |

* cited by examiner

*Primary Examiner*—Nguyen T Ha
(74) *Attorney, Agent, or Firm*—Oliff & Berridge, PLC

(57) ABSTRACT

A dielectric device has a first conductor and a dielectric disposed thereon. An intermediate region is formed between the first conductor and dielectric. In the intermediate region, an additive different from the first conductor and dielectric and the dielectric are mixed with each other. The additive contains at least one element of Si, Al, P, Mg, Mn, Y, V, Mo, Co, Nb, Fe, and Cr.

10 Claims, 10 Drawing Sheets

Fig.2
(a)
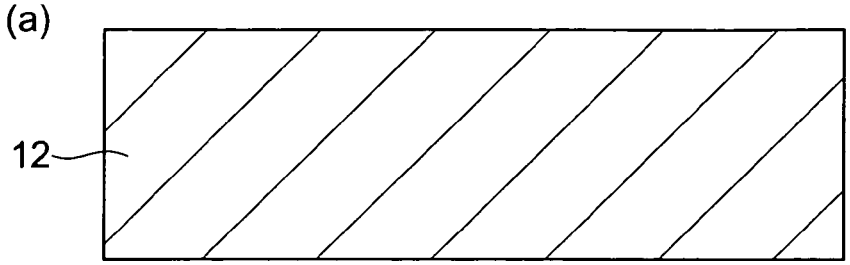
(b)
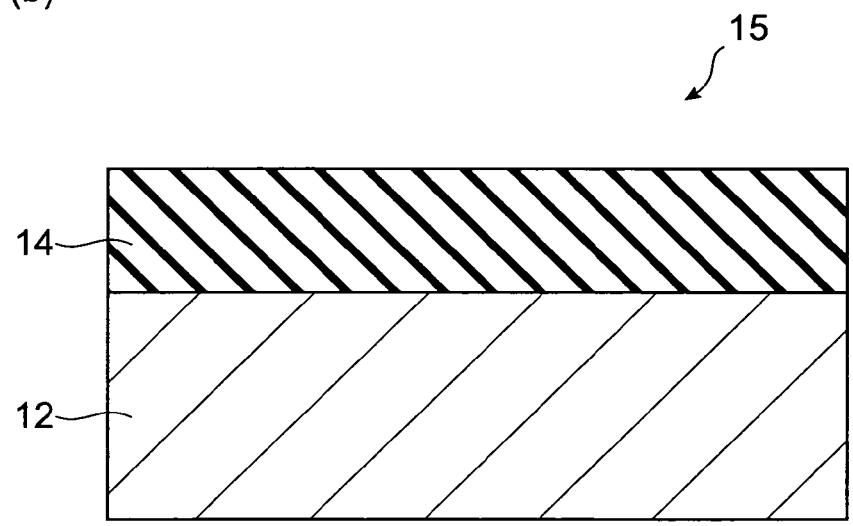
(c)
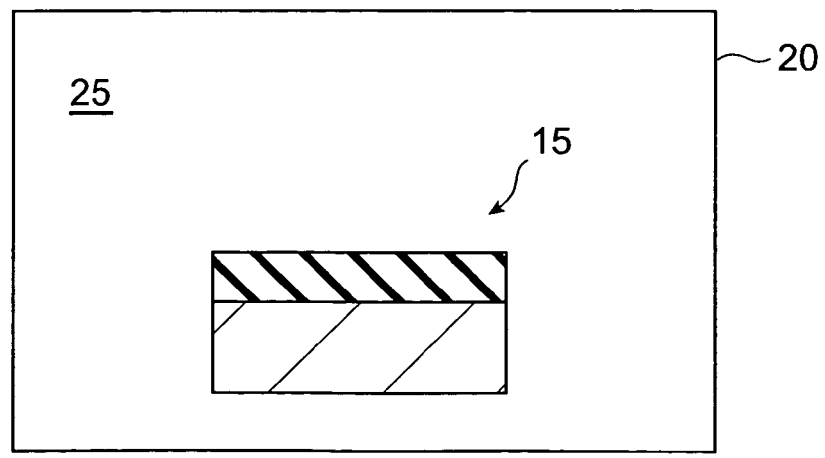

Fig.3
(d)
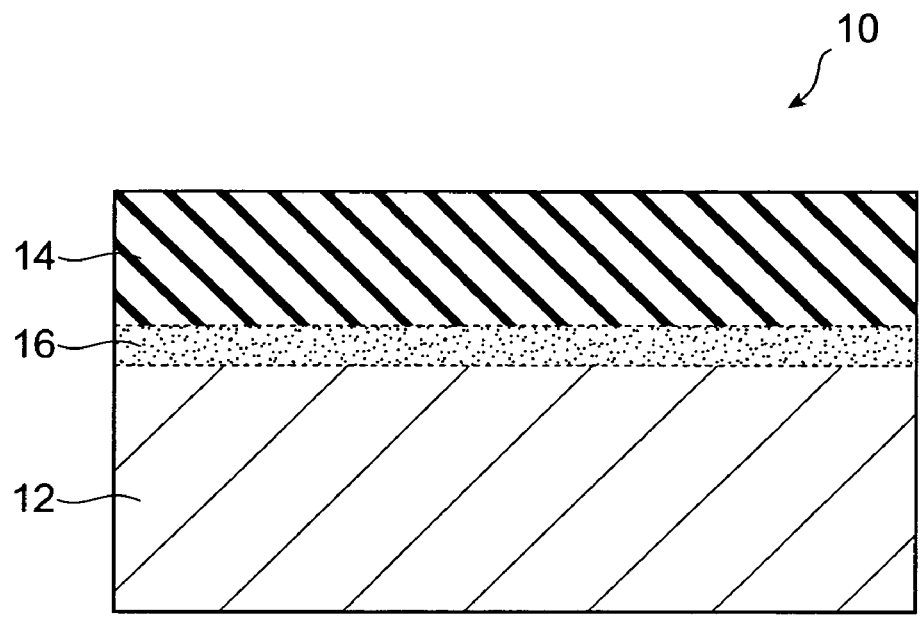
(e)
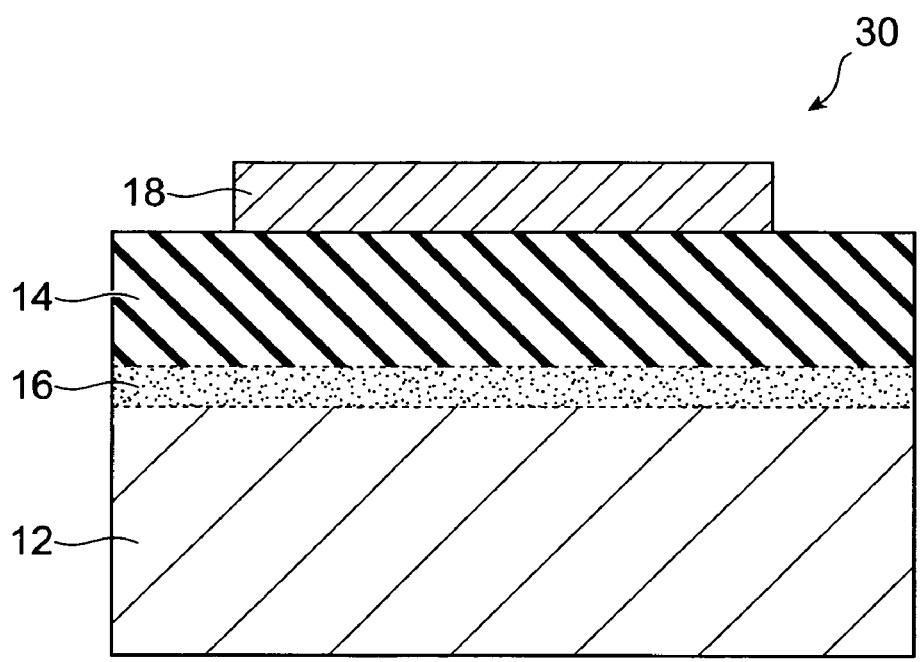

Fig.5
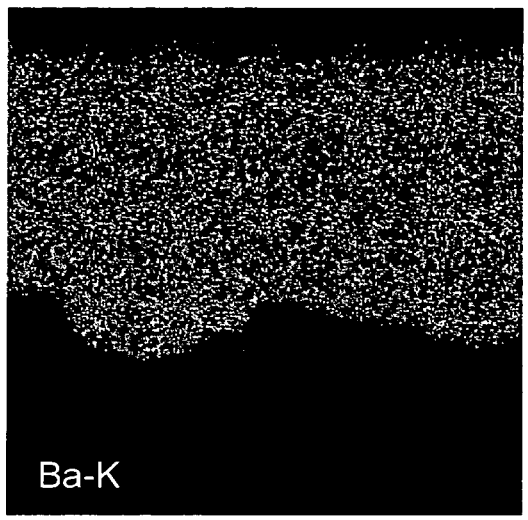
(a)
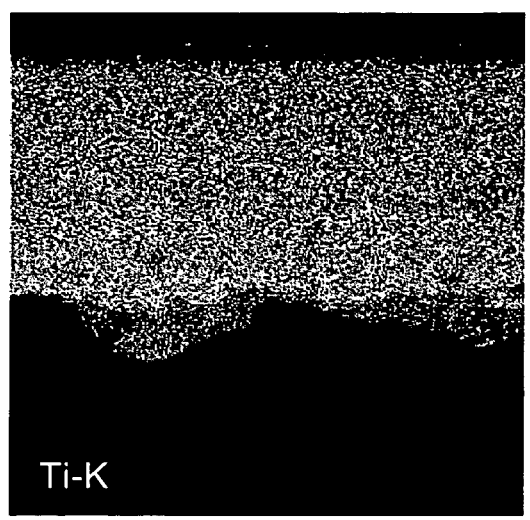
(b)
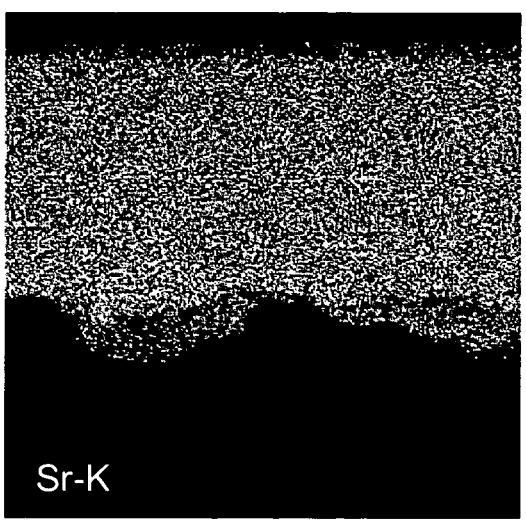
(c)
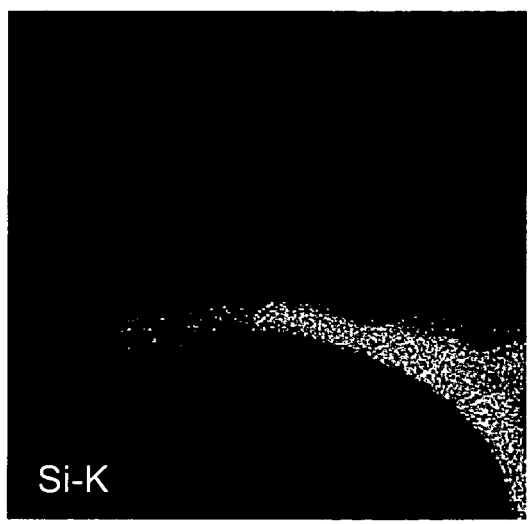
(d)

*Fig.6*
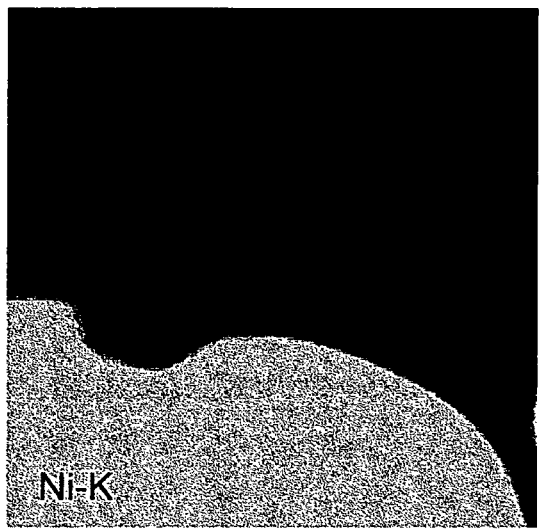
(e)
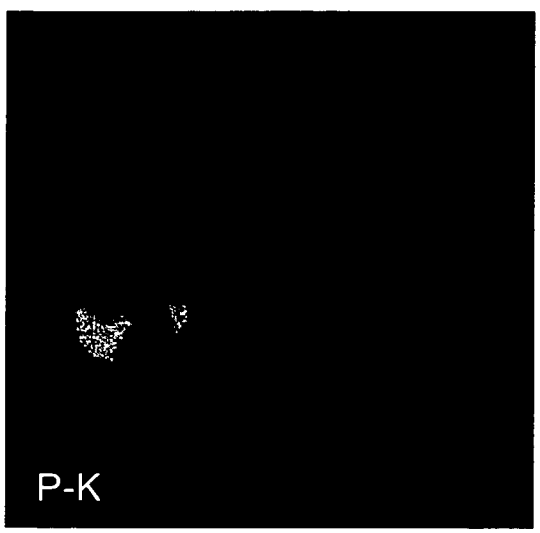
(f)
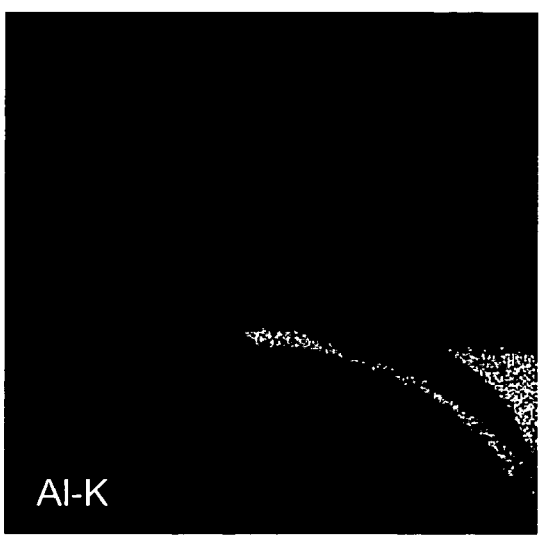
(g)
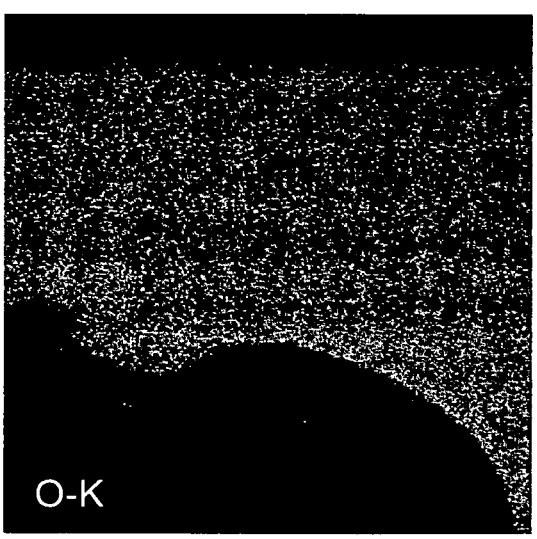
(h)

Fig.8
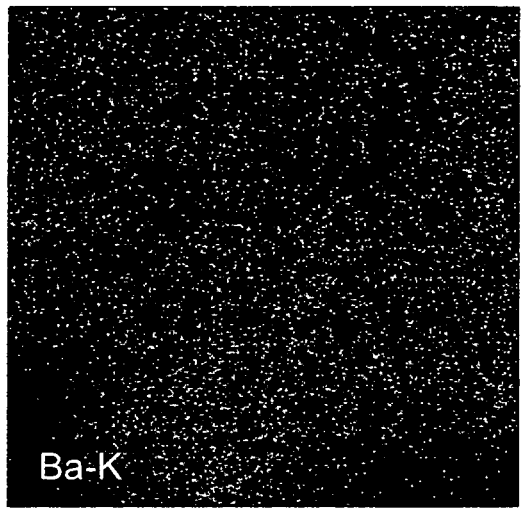
(i)
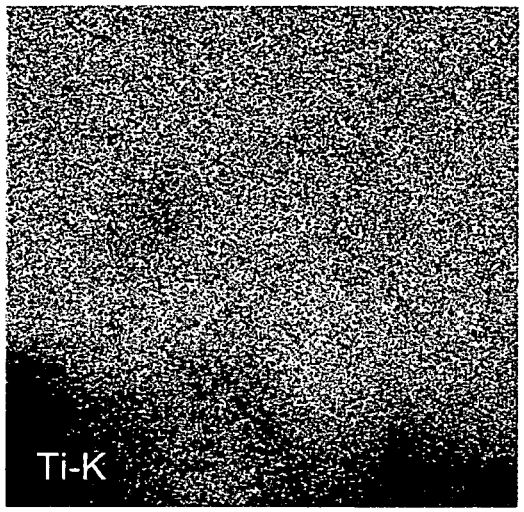
(j)
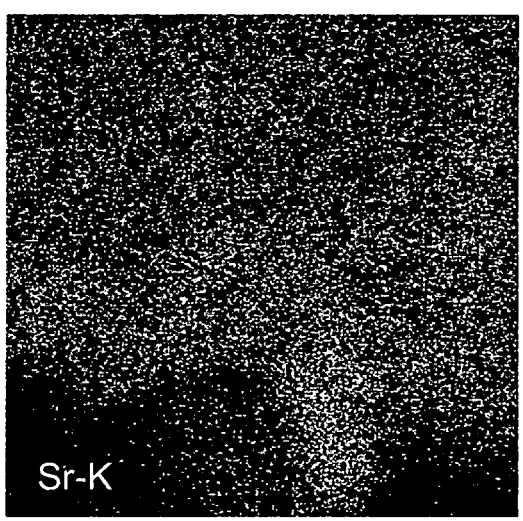
(k)
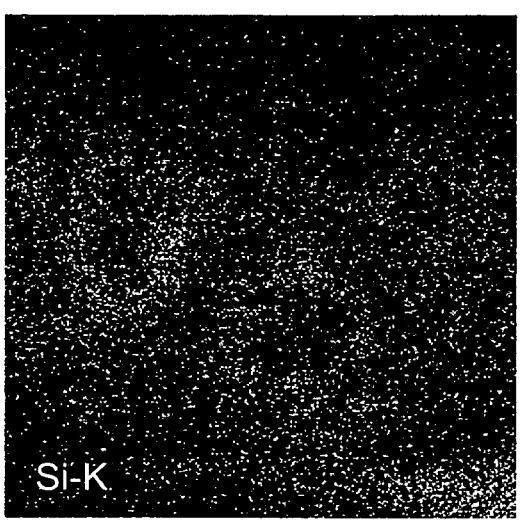
(l)

Fig.9
(a)
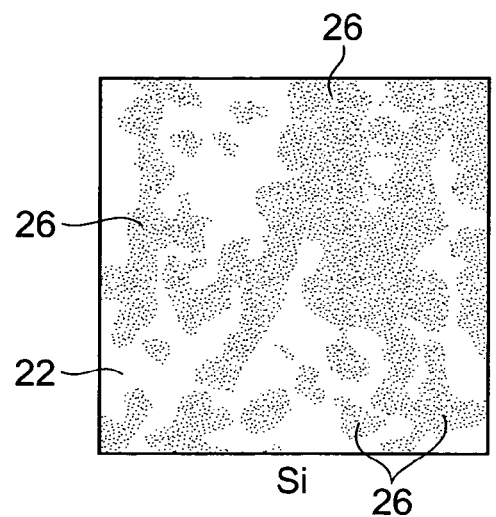
Si
(b)
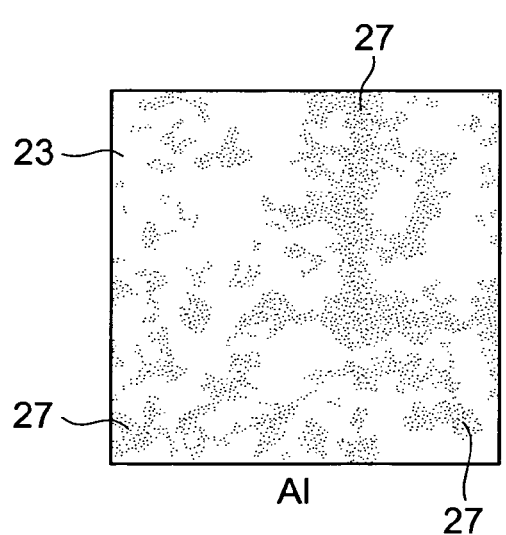
Al
(c)
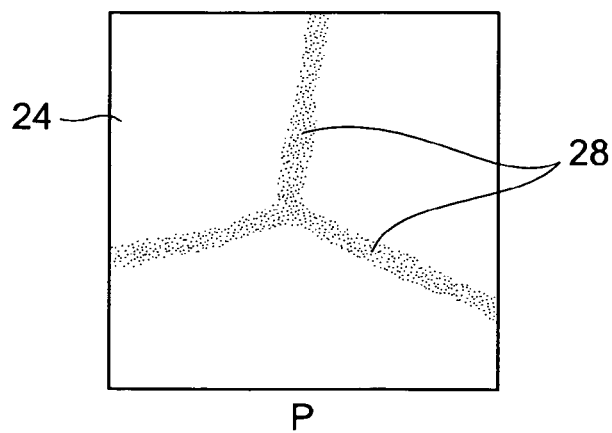
P

DIELECTRIC DEVICE AND METHOD OF MANUFACTURING THE SAME

BACKGROUND OF THE INVENTION

1. Field of the Invention

The present invention relates to a dielectric device such as thin-film capacitor and a method of manufacturing the same.

2. Related Background Art

Dielectric devices having a structure in which a dielectric is provided on a conductor such as metal have been known in general. A typical example of the dielectric devices is a thin-film capacitor. Japanese Patent Application Laid-Open No. 2000-203455 discloses a thin-film capacitor formed on a metal foil. On the other hand, Japanese Patent Application Laid-Open No. 2000-164460 discloses a method of manufacturing a thin-film capacitor comprising the steps of providing a dielectric film on a metal foil and forming a metal layer on the dielectric film.

SUMMARY OF THE INVENTION

For increasing the reliability of dielectric devices, it has been desired to enhance the adhesion between a conductor in the dielectric devices and a dielectric provided thereon. Therefore, it is an object of the present invention to provide a dielectric device which is excellent in the adhesion between the conductor and dielectric, and a method of manufacturing the same.

In one aspect, the present invention relates to a dielectric device. This dielectric device comprises a first conductor; a dielectric provided on the first conductor; and an intermediate region positioned between the first conductor and dielectric. An additive different from the first conductor and dielectric and the dielectric are mixed with each other in the intermediate region. The additive contains at least one element selected from the group consisting of Si, Al, P, Mg, Mn, Y, V, Mo, Co, Nb, Fe, and Cr. Preferably, the additive has such a concentration in the intermediate region as to enhance a critical peeling load value of the dielectric measured by scratching. The intermediate region may exist on the whole or a part of the boundary between the first conductor and dielectric. In the intermediate region, the above-mentioned element may exist either as a simple substance or an oxide. In other words, the intermediate region may include one or both of the simple substance and oxide of the element. The element in the additive and a dielectric material constituting the dielectric may partly react with each other.

The critical peeling load value represents a load required for peeling the dielectric off. The higher this value is, the stronger becomes the adhesion between the first conductor and dielectric. According to studies by the inventors, forming the intermediate region including a sufficient amount of the additive at least partly between the first conductor and dielectric can provide the dielectric with a critical peeling load value higher than that in a dielectric device having no intermediate region.

The first conductor may be constituted by Ni, Cu, or Al or an alloy mainly composed of any of them. In other words, the first conductor may substantially be made of at least one species of conductive material selected from the group consisting of Ni, Cu, Al, and alloys mainly composed of any of them. More specifically, the first conductor may contain at least one species of conductive material selected from the group consisting of Ni, Cu, Al, and alloys mainly composed of any of them by at least 95 mass % of the total. The additive may contain oxides of the above-mentioned element.

The dielectric device may further comprise a second conductor provided on the dielectric. In this case, the dielectric device can be used as a capacitor. The first conductor may contain the above-mentioned additive. In this case, it will be preferred if the concentration of the above-mentioned element in the first conductor is 10 ppm to 5000 ppm when the element is Si and 10 ppm to 3000 ppm when the element is Al, P, Mg, Mn, Y, V, Mo, Co, Nb, Fe, or Cr. When these elements are contained in the first conductor in such a concentration, heating the first conductor and the dielectric provided on the first conductor can form the intermediate region, thereby fully enhancing the adhesion strength of the dielectric and yielding favorable electric characteristics.

In another aspect, the present invention relates to a dielectric device. This dielectric device comprises a first conductor; a dielectric provided on the first conductor; and an intermediate region positioned between the first conductor and dielectric, an additive different from the first conductor and dielectric and the dielectric being mixed with each other in the intermediate region. The first conductor is constituted by Ni and contains an additive, the additive contains Si, and Si in the first conductor has a concentration of 10 ppm to 5000 ppm. In the first conductor and intermediate region, Si may exist as either a simple substance or an oxide. In other words, the first conductor and intermediate region may contain one or both of the simple substance and oxide of Si.

When Si is contained in the first conductor by the above-mentioned concentration, heating the first conductor and the dielectric provided on the first conductor can form the intermediate region, thereby fully enhancing the adhesion of the dielectric, and yielding favorable electric characteristics upon making a capacitor by providing a second conductor on the dielectric.

Any of the above-mentioned dielectric devices can use an oxide as a dielectric (dielectric material). A preferred example of the dielectric oxide is an oxide of perovskite type having a composition represented by a general formula of $ABO_3$. Preferred as the perovskite type oxide is an oxide containing at least one element selected from the group consisting of Ba, Sr, Ca, Pb, Ti, Zr, and Hf. Examples of this oxide include $BaTiO_3$, $SrTiO_3$, $(BaSr)TiO_3$, $(BaSr)(TiZr)O_3$, and $BaTiZrO_3$. The dielectric may contain at least one of these oxides.

The first conductor may be a metal foil. The metal foil is self-supportable and thus can be used as a base for supporting the dielectric. This makes it unnecessary to prepare a base separately from the first conductor. However, the dielectric device in accordance with the present invention may further comprise a base for supporting the first conductor and dielectric.

In still another aspect, the present invention relates to a method of manufacturing a dielectric device. This method comprises the steps of preparing a first conductor containing at least one element selected from the group consisting of Si, Al, P, Mg, Mn, Y, V, Mo, Co, Nb, Fe, and Cr as an additive; providing a dielectric constituted by a material different from the additive on the first conductor; and heating the first conductor and dielectric so as to form an intermediate region between the first conductor and dielectric, the additive and the dielectric being mixed with each other in the intermediate region, thereby enhancing a critical peeling load value of the dielectric measured by scratching. The intermediate region may exist on the whole or a part of the boundary between the first conductor and dielectric. In the intermediate region, the above-mentioned element may exist either as a simple substance or an oxide. In other words, the intermediate region may include one or both of the simple substance and oxide of the element. The element in the additive and a dielectric material constituting the dielectric may partly react with each other.

Forming the intermediate region including a sufficient amount of the additive at least partly between the first conductor and dielectric can provide the dielectric with a critical peeling load value higher than that in a dielectric device having no intermediate region.

In still another aspect, the present invention relates to a method of manufacturing a dielectric device. This method comprises the steps of preparing a first conductor containing an additive; providing a dielectric constituted by a material different from the additive on the first conductor; and heating the first conductor and dielectric so as to form an intermediate region between the first conductor and dielectric, the additive and the dielectric being mixed with each other in the intermediate region. The first conductor may be constituted by Ni, the additive may contain Si, and Si in the first conductor may have a concentration of 10 ppm to 5000 ppm. The intermediate region may exist on the whole or a part of the boundary between the first conductor and dielectric. In the intermediate region, Si may exist either as a simple substance or an oxide. In other words, the intermediate region may contain one or both of the simple substance and oxide of Si.

When Si is contained in the first conductor by the above-mentioned concentration, heating the first conductor and the dielectric provided on the first conductor can form the intermediate region, thereby fully enhancing the adhesion of the dielectric, and yielding favorable electric characteristics upon making a capacitor by providing a second conductor on the dielectric.

BRIEF DESCRIPTION OF THE DRAWINGS

FIG. 2 is a schematic view showing a method of manufacturing the dielectric device.

FIG. 3 is a schematic view showing a method of manufacturing a thin-film capacitor.

FIG. 5 is a view showing distributions of elements in the cross section of the dielectric device.

FIG. 6 is a view showing distributions of elements in the cross section of the dielectric device.

FIG. 8 is a view showing distributions of elements in the cross section of the dielectric device.

FIG. 9 is a schematic view showing distributions of additives on a surface of an Ni foil.

DESCRIPTION OF THE PREFERRED EMBODIMENTS

In the following, embodiments of the present invention will be explained in detail with reference to the accompanying drawings. In the explanation of the drawings, the same constituents will be referred to with the same numerals without repeating their overlapping descriptions.

Figure 1:
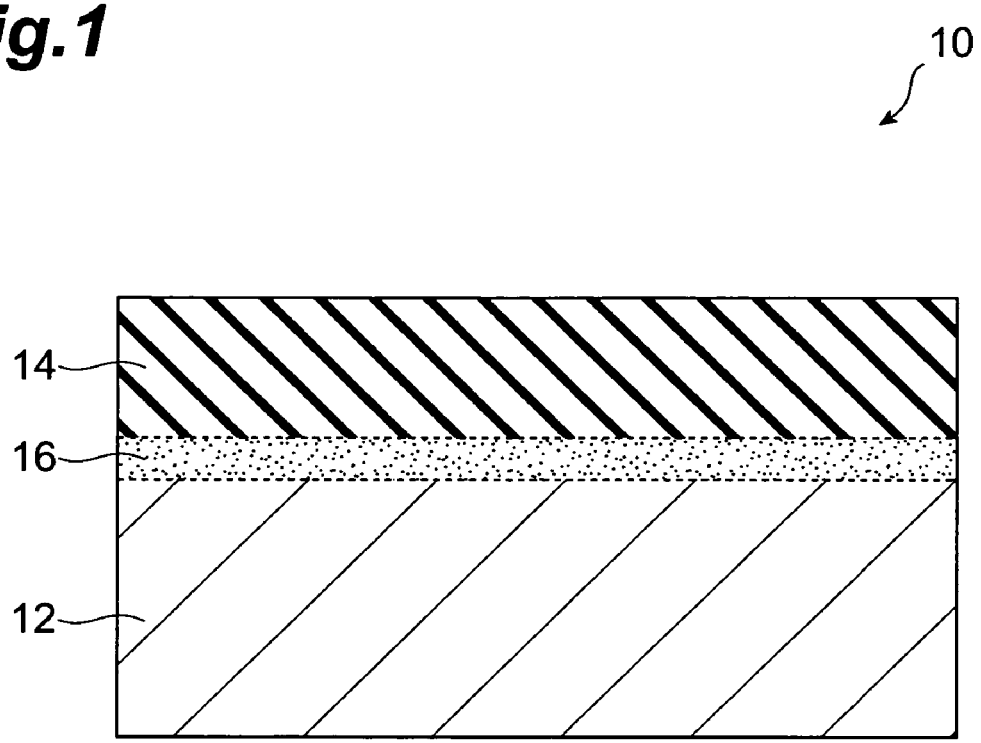
FIG. 1 is a schematic sectional view showing the structure of a dielectric device in accordance with an embodiment.

FIG. 1 is a schematic sectional view showing the structure of a dielectric device 10 in accordance with an embodiment of the present invention. The dielectric device 10 has a base 12 which is a first conductor and a dielectric film 14 provided on the base 12. The base 12 is a conductor layer constituted by a conductive material. The dielectric film 14 is a dielectric constituted by a dielectric material. In this embodiment, the base 12 is an Ni foil, whereas the dielectric film 14 is constituted by BST, i.e., barium strontium titanate $(BaSr)TiO_3$. The base 12 has such a thickness as to be able to support the dielectric film 14 and maintain a sufficient strength. In this embodiment, the thickness of the base 12 is about 100 μm, whereas the thickness of the dielectric film 14 is about 500 nm. Metal foils such as Ni foils are self-supportable and can favorably be used as the base 12 for supporting the dielectric film 14.

An intermediate region 16 is formed between the base 12 and dielectric film 14. In the intermediate region 16, an additive different from Ni constituting the base 12 and BST constituting the dielectric film 14 is mixed with BST. As will be explained later, the additive enhances the adhesion of the dielectric film 14 to the base 12. Preferably, the additive is contained in the intermediate region 16 by a concentration sufficient for enhancing the adhesion of the dielectric film 14 by at least 1.5 times.

A method of manufacturing the dielectric device 10 will now be explained with reference to FIGS. 2 and 3. First, as shown in FIG. 2(a), an Ni foil made by rolling is prepared as the base 12. However, the method of making the metal foil for the base 12 in the present invention is not limited to rolling, but may be any of other methods such as electrolysis.

The Ni foil used in this embodiment is doped with a sufficient amount of Si. Though the Ni foil is also doped with other elements such as Ti, Mg, Al, and P, Si has the highest concentration. Preferably, these additives have such a concentration as to enhance the critical peeling load value of the dielectric film 14 measured by scratching, which will be explained later, by at least 1.5 times. Preferred concentrations of the additives will be explained later in detail.

Subsequently, as shown in FIG. 2(b), a BST thin film is formed as the dielectric film 14 on the base 12, so as to make a multilayer structure 15. In this embodiment, BST is deposited by sputtering on the base 12, so as to form the dielectric film 14. However, the method of forming the dielectric film 14 is not limited to sputtering in the present invention, whereby the dielectric film 14 may be formed by any of other methods such as chemical solution methods. Here, the composition of BST is $Ba_{0.7}Sr_{0.3}TiO_3$. However, the composition ratio between Ba and Sr is not limited to 7:3, whereby any other composition ratios can be employed.

Next, as shown in FIG. 2(c), the multilayer structure 15 is introduced into an annealing furnace 20, and is heated in a high-temperature gas atmosphere 25 for a predetermined time. This annealing process improves the crystallinity of the dielectric film 14, while forming the intermediate region 16 on the boundary between the base 12 and dielectric film 14 (FIG. 3(d)). The annealing process causes the additives in the base 12 to flocculate into BST constituting the dielectric film 14, whereby the intermediate region 16 is formed. Therefore, in the intermediate region 16, the additives are mixed with BST.

For preventing the base 12, i.e., Ni foil, from being oxidized, a reducing atmosphere, a reduced-pressure atmosphere, or a reduced-pressure reducing atmosphere is used as the atmosphere 25. Here, the reduced-pressure atmosphere refers to an atmosphere having a pressure lower than 1 atm (=101325 Pa), whereas the reduced-pressure reducing atmosphere refers to a reducing atmosphere having a pressure lower than 1 atm. For sufficiently improving the crystallinity of the dielectric film 14, it will be preferred if the temperature of the atmosphere 25 is 400° C. or higher. In this embodiment, the temperature of the atmosphere 25 is set to 800° C.

Forming the intermediate region 16 completes the dielectric device 10. The intermediate region 16 may exist on the whole or a part of the boundary between the base 12 and dielectric film 14.

Since BST constituting the dielectric film 14 contains oxygen, the additives in the Ni foil may bind to oxygen when flocculated into the intermediate region 16. Therefore, there is a strong possibility that at least a part of the additives in the intermediate region 16 exists as an oxide.

Figure 4:
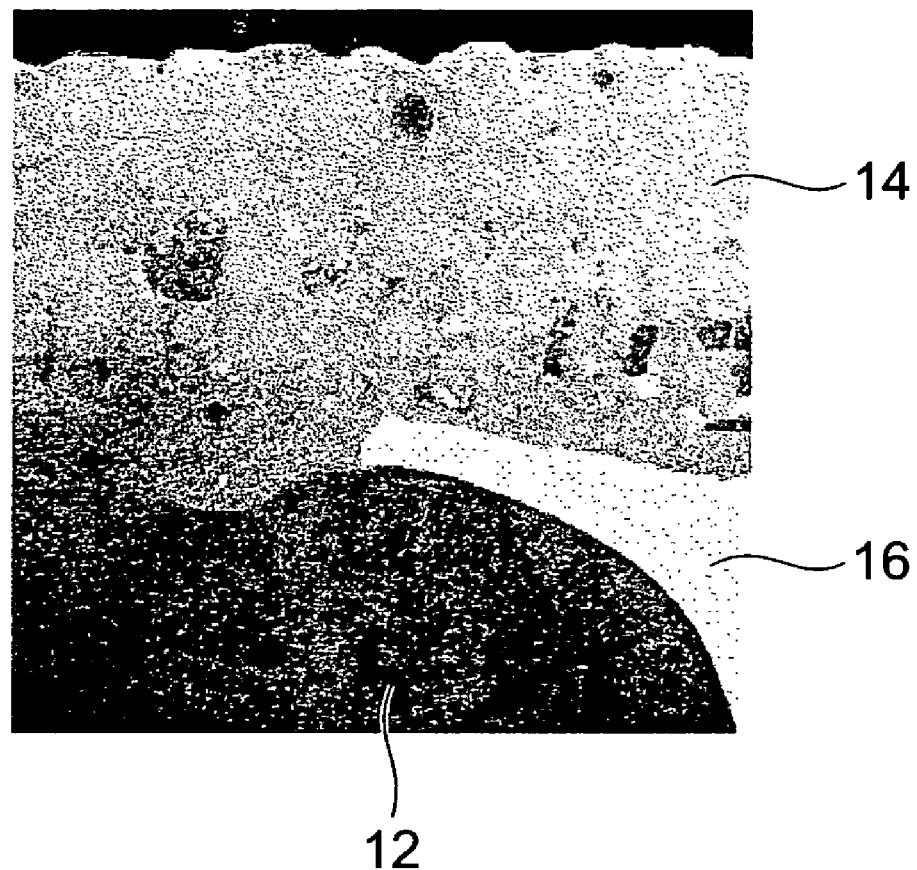
FIG. 4 is an electron micrograph of a cross section of the dielectric device.

The inventors conducted energy dispersive x-ray spectroscopy (EDS) by using a transmission electron microscope (TEM), so as to measure distributions of elements in the dielectric device 10. FIG. 4 is a photograph of a cross section taken with the TEM, whereas FIGS. 5 and 6 show distributions of elements measured at the same cross section. In FIG. 5, (a), (b), (c), and (d) indicate distributions of Ba, Ti, Sr, and Si, respectively. In FIG. 6, (e), (f), (g), and (h) indicate distributions of Ni, P, Al, and O, respectively. In FIGS. 5 and 6, regions where the respective elements exist are represented by white spots.

In the intermediate region 16, as can be seen from these charts, Ni which is a main ingredient of the base 12 hardly exists, while the elements in BST are mixed with Si, P, and Al which are additives in the Ni foil. As shown in FIG. 6(h), O is distributed over the whole area of the intermediate region, whereby major parts of Si, P, and Al seem to bind to O, so as to form oxides.

Figure 7:
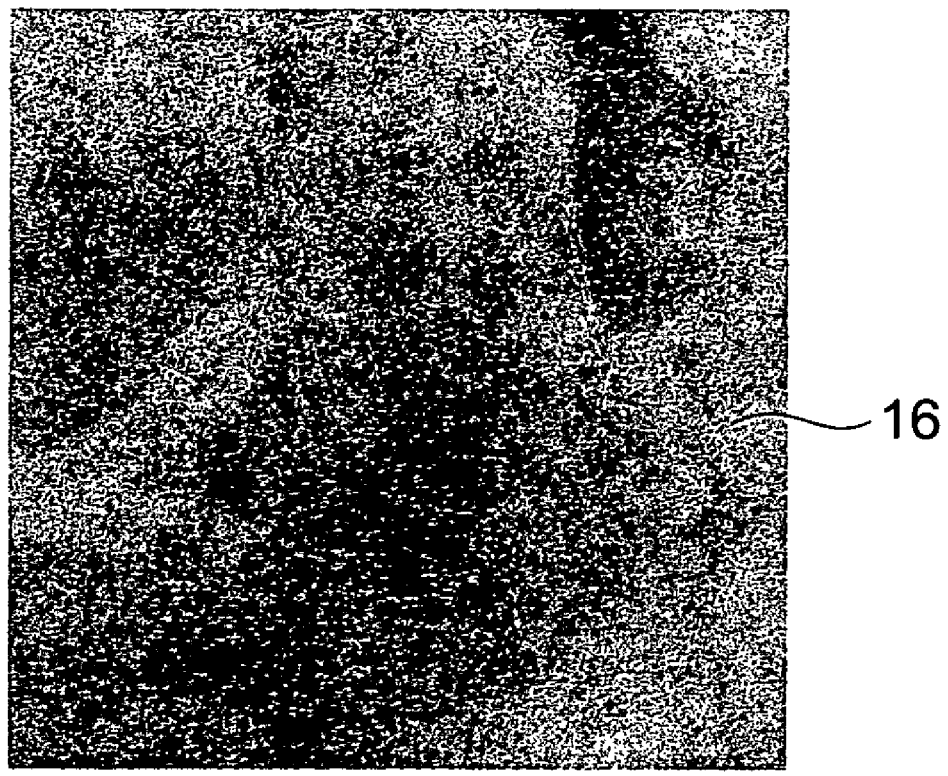
FIG. 7 is an electron micrograph of a cross section of the dielectric device.

FIG. 7 is a photograph of a cross section enlarging a part of the intermediate region 16 in FIG. 5, whereas FIG. 8 shows distributions of elements measured at the same cross section. In FIG. 8, (i), (j), (k), and (l) indicate distributions of Ba, Ti, Sr, and Si, respectively. In FIG. 8, regions where the respective elements exist are represented by white spots.

As shown in FIG. 8(l), Si is distributed substantially uniformly without segregation as with the elements in BST. Therefore, Si and BST seem to react with each other in at least a part of the intermediate region 16.

Further, using the dielectric device 10, a thin-film capacitor is made in this embodiment. The thin-film capacitor is also one of dielectric devices. Specifically, as shown in FIG. 3(e), an upper electrode 18 is formed on the dielectric film 14, so as to yield a thin-film capacitor 30. In this embodiment, the upper electrode 18 is constituted by Cu. Here, the base 12 made of the Ni foil functions as a lower electrode of the thin-film capacitor 30.

By preparing a plurality of Ni rolled foils doped with various concentrations of Si, the inventors manufactured a plurality of dielectric devices 10 and thin-film capacitors 30, and measured the adhesion of the dielectric film 14 and electric characteristics of the thin-film capacitor 30, i.e., capacity density (C/A) and leak characteristic, in each of them. The capacity density is defined by (capacitance of thin-film capacitor 30)/(area of electrode 18).

The adhesion of the dielectric film 14 was measured by using the dielectric device 10 instead of the thin-film capacitor 30. The measurement was conducted by scratching with an ultrathin film scratch tester CSR-02 of Rhesca Co., Ltd. As has been publicly known, the scratching is a method in which a hard indenter having a fixed radius of curvature is pressed against a surface of a film to be measured and scratches the surface of the film while increasing the load applied to the indenter, and a load value at which destruction of the film (e.g., peeling of the film from its backing material) occurs is measured. This load value is referred to as "critical peeling load value".

The adhesion strength of the film can be calculated by using this critical load value. Namely, as the maximum stress acting on a peripheral part of an indent formed by the indenter, the adhesion strength F of the film is represented by the following expression:

$$F = \frac{H}{\sqrt{\frac{\pi R^2 H}{W} - 1}} \quad (1)$$

Here, R is the radius of curvature of the indenter, and H is the Brinell hardness of the backing material.

The following Table 1 shows the results of measurement of critical peeling load values of the dielectric films 14 and electric characteristics of the thin-film capacitors 30.

TABLE 1

| Si concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.7 \times 10^{-7}$ |
| 100 | 20 | 3.5 | $1.8 \times 10^{-7}$ |
| 500 | 23 | 3.5 | $2.0 \times 10^{-7}$ |
| 1000 | 23 | 3.5 | $2.2 \times 10^{-7}$ |
| 5000 | 25 | 3.0 | $2.8 \times 10^{-7}$ |
| 10000 | 25 | 2.4 | $3.4 \times 10^{-5}$ |

In this table, "leak characteristic" indicates the current density of the leak current occurring when applying a voltage of 3 V between the lower electrode (i.e., base 12) and upper electrode 18 of the thin-film capacitor 30 at room temperature. The "Si concentration" indicates the concentration of the simple substance of Si added to the Ni foil or the value obtained by converting the concentration of oxides of Si into the concentration of Si.

As shown in Table 1, the critical peeling load value of the dielectric film 14 was 10 mN when the concentration of Si added to the Ni foil was 0 i.e., when the Ni foil was doped with no Si, so that no Si existed in the intermediate region 16. When the Si concentration was 10 ppm, by contrast, the critical peeling load value was 15 mN, thus increasing by 1.5 times that obtained when the Si concentration was 0. As the Si concentration rose, the critical peeling load value increased, whereby a critical peeling load value of 25 mN was obtained at Si concentrations of 5000 ppm and 10000 ppm. Thus, forming an intermediate region where Si exists can easily realize an improvement by 1.5 times or more of the critical peeling load value of the dielectric film 14, which has not been achieved conventionally.

On the other hand, the Si concentration exceeding 5000 ppm deteriorates electric characteristics of the thin-film capacitor 30 (more specifically, its capacity density (C/A) and leak characteristic), though the critical peeling load value of the dielectric film 14 is high. This seems to be because Si and oxides of Si diffuse into the dielectric film 14, and partly react with BST as the case may be, thereby deteriorating properties of BST as a dielectric.

The reason why the adhesion of the dielectric film 14 is improved by the intermediate region 16 has not been clear yet. For elucidating the reason, the inventors annealed an Ni rolled foil made by the same method as with the base 12, and then analyzed distributions of additives on a surface of the Ni rolled foil by using an EPMA (Electron Probe Micro Analyzer). FIG. 9 is a schematic view showing distributions of additives measured by the EPMA. Here, FIG. 9(a) shows the distribution of Si, in which a white region 22 indicates an area with a low Si concentration, whereas a region 26 with spots indicates an area with a high Si concentration. FIG. 9(b) shows the distribution of Al, in which a white region 26 indicates an area with a low Al concentration, whereas a region 26 with spots indicates an area with a high Al concentration. FIG. 9(c) shows the distribution of P, in which a white region 24 indicates an area with a low P concentration, whereas a region 28 with spots indicates an area with a high P concentration. The thickness of the Ni foil used for the analysis was 300 μm. This Ni foil was heated for 1 hour in a reducing atmosphere ($H_2$: 5000 ppm; Dp=50° C.) at 800° C.

FIG. 9 clarifies that additives are deposited on the surface of the Ni foil by the annealing process mentioned above and that the additives have nonuniform distributions on the surface of the Ni foil. In particular, P is distributed linearly along crystal grain boundaries of Ni. While FIG. 9 shows Si, Al, and P among the additives in the Ni foil, other additives were also deposited on the surface of the Ni foil according to results of the analysis. There is a possibility of irregularities having been formed on the surface of the Ni foil because of the nonuniform distributions of additives (impurities). Similarly, it seems that additives nonuniformly flocculate on the boundary between the base 12 and dielectric film 14, thereby forming irregularities on the boundary in the above-mentioned dielectric device 10 as well. The inventors consider that there is a possibility that the irregularities mesh with the dielectric film 14, thereby improving the adhesion of the dielectric film 14.

According to the above-mentioned results of various experiments, the inventors infer as follows. Namely, a preferred concentration of Si in the Ni foil is 10 ppm to 5000 ppm in the dielectric device 10 and thin-film capacitor 30. The adhesion between the base 12 and dielectric film 14 is hard to enhance sufficiently when the concentration of Si in the Ni foil is less than 10 ppm, whereas the deterioration in electric characteristics of the thin-film capacitor 30 becomes remarkable when the Si concentration exceeds 5000 ppm. The Si concentration falling within the range of 10 to 5000 ppm can sufficiently improve the adhesion of the dielectric film 14 while yielding favorable electric characteristics.

A more preferred concentration of Si is 100 ppm to 1000 ppm. According to Table 1 mentioned above, the critical peeling load value of the dielectric film 14 can be enhanced by 2 times or more when the Si concentration in the Ni foil is at least 100 ppm. On the other hand, the Si concentration of 1000 ppm or less in the Ni foil can prevent the capacity density (C/A) from deteriorating.

Thus, since the dielectric device 10 and thin-film capacitor 30 in accordance with this embodiment have the intermediate region 16 containing Si as an additive, the adhesion of the dielectric film 14 is improved. When the Si concentration is appropriately adjusted, favorable electric characteristics of the thin-film capacitor 30 can be obtained while keeping a high adhesion of the dielectric film 14.

The present invention is explained in detail according to its embodiments in the foregoing. However, the present invention is not limited to the above-mentioned embodiments. The present invention can be modified in various ways within a scope not deviating from the gist thereof.

According to the knowledge of the inventors, not only Si but also Al, P, Mg, Mn, Y, V, Mo, Co, Nb, Fe, and Cr act to enhance the adhesion of the dielectric to the conductor. Namely, the intermediate region 16 formed at the boundary between the conductor and dielectric may contain at least one element selected from the group consisting of Al, P, Mg, Mn, Y, V, Mo, Co, Nb, Fe, and Cr. These elements may also be added to the backing material (base 12 in the above-mentioned embodiment) of the dielectric. The following Tables 2 to 12 show results of measurement of the critical peeling load value of the dielectric film 14 and electric characteristics of the thin-film capacitor 30 in the respective cases where the intermediate region 16 contains the above-mentioned elements. The method of measurement is as mentioned above in connection with Table 1. In these tables, the "concentration" of each element represents the concentration of the simple substance of the element in the first conductor or the value obtained by converting the concentration of oxides of the element into the concentration of the element. All the elements are found to yield favorable critical peeling load values and electric characteristics of the thin-film capacitors 30 in the appropriate concentration range.

TABLE 2

| Al concentration (ppm) | critical peeling load value (mN) | C/A (μF/cm$^2$) | leak characteristic (A/cm$^2$) |
|---|---|---|---|
| 0 | 10 | 3.5 | $1.7 \times 10^{-7}$ |
| 10 | 15 | 3.5 | $1.7 \times 10^{-7}$ |
| 100 | 18 | 3.5 | $1.7 \times 10^{-7}$ |
| 500 | 20 | 3.5 | $2.0 \times 10^{-7}$ |
| 1000 | 23 | 3.5 | $2.2 \times 10^{-7}$ |
| 3000 | 23 | 3.1 | $3.1 \times 10^{-7}$ |
| 5000 | 24 | 2.6 | $4.5 \times 10^{-5}$ |

TABLE 3

| P concentration (ppm) | critical peeling load value (mN) | C/A (μF/cm$^2$) | leak characteristic (A/cm$^2$) |
|---|---|---|---|
| 0 | 10 | 3.5 | $1.7 \times 10^{-7}$ |
| 10 | 15 | 3.5 | $1.7 \times 10^{-7}$ |
| 100 | 17 | 3.5 | $2.1 \times 10^{-7}$ |
| 500 | 20 | 3.5 | $2.5 \times 10^{-7}$ |
| 1000 | 20 | 3.5 | $3.2 \times 10^{-7}$ |
| 3000 | 21 | 3.0 | $4.1 \times 10^{-7}$ |
| 5000 | 23 | 2.3 | $8.0 \times 10^{-5}$ |

TABLE 4

| Mg concentration (ppm) | critical peeling load value (mN) | C/A (μF/cm$^2$) | leak characteristic (A/cm$^2$) |
|---|---|---|---|
| 0 | 10 | 3.5 | $1.7 \times 10^{-7}$ |
| 10 | 15 | 3.5 | $1.7 \times 10^{-7}$ |
| 100 | 18 | 3.5 | $2.0 \times 10^{-7}$ |
| 500 | 20 | 3.5 | $2.1 \times 10^{-7}$ |
| 1000 | 23 | 3.5 | $2.3 \times 10^{-7}$ |
| 3000 | 23 | 3.1 | $3.8 \times 10^{-7}$ |
| 5000 | 23 | 2.3 | $7.5 \times 10^{-5}$ |

TABLE 5

| Mn concentration (ppm) | critical peeling load value (mN) | C/A (μF/cm$^2$) | leak characteristic (A/cm$^2$) |
|---|---|---|---|
| 0 | 10 | 3.5 | $1.7 \times 10^{-7}$ |
| 10 | 16 | 3.5 | $1.6 \times 10^{-7}$ |
| 100 | 18 | 3.7 | $1.4 \times 10^{-7}$ |
| 500 | 20 | 3.6 | $1.6 \times 10^{-7}$ |
| 1000 | 22 | 3.5 | $1.9 \times 10^{-7}$ |

TABLE 5-continued

| Mn concentration (ppm) | critical peeling load value (mN) | C/A ($\mu F/cm^2$) | leak characteristic ($A/cm^2$) |
|---|---|---|---|
| 3000 | 22 | 3.2 | $2.5 \times 10^{-7}$ |
| 5000 | 23 | 2.7 | $5.0 \times 10^{-5}$ |

TABLE 6

| Y concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.6 \times 10^{-7}$ |
| 100 | 17 | 3.6 | $1.7 \times 10^{-7}$ |
| 500 | 20 | 3.6 | $2.1 \times 10^{-7}$ |
| 1000 | 20 | 3.5 | $3.2 \times 10^{-7}$ |
| 3000 | 20 | 3.2 | $3.7 \times 10^{-7}$ |
| 5000 | 21 | 2.8 | $5.4 \times 10^{-5}$ |

TABLE 7

| V concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.7 \times 10^{-7}$ |
| 100 | 17 | 3.6 | $2.1 \times 10^{-7}$ |
| 500 | 20 | 3.6 | $2.5 \times 10^{-7}$ |
| 1000 | 20 | 3.5 | $3.2 \times 10^{-7}$ |
| 3000 | 22 | 3.1 | $3.5 \times 10^{-7}$ |
| 5000 | 23 | 2.5 | $6.7 \times 10^{-5}$ |

TABLE 8

| Mo concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.7 \times 10^{-7}$ |
| 100 | 18 | 3.5 | $1.9 \times 10^{-7}$ |
| 500 | 20 | 3.5 | $2.1 \times 10^{-7}$ |
| 1000 | 22 | 3.5 | $2.3 \times 10^{-7}$ |
| 3000 | 23 | 3.0 | $4.2 \times 10^{-7}$ |
| 5000 | 23 | 2.4 | $7.7 \times 10^{-5}$ |

TABLE 9

| Co concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 16 | 3.5 | $1.7 \times 10^{-7}$ |
| 100 | 18 | 3.5 | $2.2 \times 10^{-7}$ |
| 500 | 20 | 3.5 | $2.3 \times 10^{-7}$ |
| 1000 | 22 | 3.5 | $2.7 \times 10^{-7}$ |
| 3000 | 22 | 3.2 | $3.5 \times 10^{-7}$ |
| 5000 | 23 | 2.3 | $6.3 \times 10^{-5}$ |

TABLE 10

| Nb concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.7 \times 10^{-7}$ |
| 100 | 17 | 3.5 | $2.0 \times 10^{-7}$ |
| 500 | 20 | 3.5 | $2.1 \times 10^{-7}$ |
| 1000 | 21 | 3.5 | $3.2 \times 10^{-7}$ |
| 3000 | 22 | 3.1 | $3.7 \times 10^{-7}$ |
| 5000 | 24 | 2.6 | $3.4 \times 10^{-5}$ |

TABLE 11

| Fe concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 15 | 3.5 | $1.7 \times 10^{-7}$ |
| 100 | 17 | 3.6 | $2.1 \times 10^{-7}$ |
| 500 | 20 | 3.5 | $2.5 \times 10^{-7}$ |
| 1000 | 20 | 3.5 | $3.2 \times 10^{-7}$ |
| 3000 | 22 | 3.1 | $4.8 \times 10^{-7}$ |
| 5000 | 23 | 2.5 | $6.7 \times 10^{-5}$ |

TABLE 12

| Cr concentration (ppm) | critical peeling load value (mN) | C/A ($\mu F/cm^2$) | leak characteristic ($A/cm^2$) |
|---|---|---|---|
| 0 | 10 | 3.5 | $1.7 \times 10^{-7}$ |
| 10 | 16 | 3.5 | $1.6 \times 10^{-7}$ |
| 100 | 19 | 3.5 | $1.7 \times 10^{-7}$ |
| 500 | 20 | 3.5 | $2.1 \times 10^{-7}$ |
| 1000 | 21 | 3.5 | $3.2 \times 10^{-7}$ |
| 3000 | 24 | 3.1 | $3.7 \times 10^{-7}$ |
| 5000 | 25 | 2.3 | $5.4 \times 10^{-5}$ |

The backing material (base 12 in the above-mentioned embodiment) of the dielectric is not limited to Ni, but may be constituted by Cu or Al or an alloy mainly composed of Ni, Cu, or Al. The dielectric is not limited to BST. The dielectric may be an oxide, a preferred example of which is an oxide of perovskite type having a composition represented by a general formula of $ABO_3$. Examples of the perovskite type oxide include oxides containing at least one element selected from the group consisting of Ba, Sr, Ca, Pb, Ti, Zr, and Hf. More specific examples of the perovskite type oxide include BT, i.e., barium titanate $BaTiO_3$, strontium titanate $SrTiO_3$, (BaSr)(TiZr) $O_3$, and $BaTiZrO_3$ in addition to BST. The dielectric may contain one or more of these oxides. The upper electrode 18 may be constituted by metals other than Cu (e.g., Pt) or alloys as well.

Figure 10:
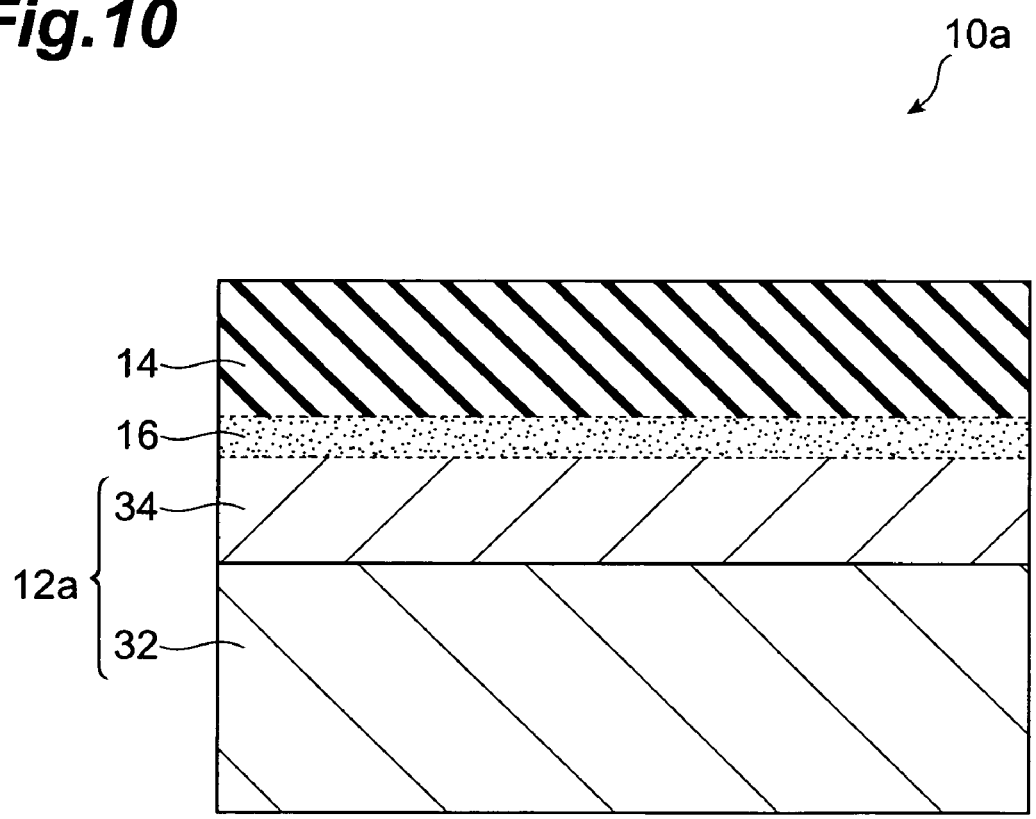
FIG. 10 is a schematic sectional view showing a modified example of the dielectric device.

In the above-mentioned embodiment, the base 12 supporting the dielectric film 14 also acts as the lower electrode of the thin-film capacitor 30. As shown in FIG. 10, a substrate 32 supporting a conductor layer 34 which is a first conductor and a dielectric film 14 may be provided as a base instead. FIG. 10 is a schematic sectional view showing thus modified dielectric device 10a. The substrate 32 has a sufficient thickness, and supports the conductor layer 34 and dielectric film 14. In other words, a layer 12a constituted by the substrate 32 and dielectric layer 34 functions as a base for supporting the dielectric film 14. When an upper electrode is provided on the dielectric film 14 so as to form a thin-film capacitor, the conductor layer 34 functions as a lower electrode.

The present invention can provide a dielectric device which is excellent in adhesion between the conductor and dielectric, and a method of manufacturing the same.

What is claimed is:

1. A dielectric device comprising:
   a first conductor film;
   a dielectric film provided on the first conductor film; and
   an intermediate region positioned between the first conductor film and the dielectric film, wherein
   the intermediate region contains a mixture of an additive that is different from a material of the first conductor film and from a material of the dielectric film, and a dielectric that is same as the material of the dielectric film, and
   the additive contains at least one element selected from the group consisting of Si, Al, P, Mg, Mn, Y, V, Mo, Co, Nb, Fe and Cr.

2. The dielectric device according to claim 1,
   wherein the additive has such a concentration in the intermediate region as to enhance a critical peeling load value of the dielectric film measured by scratching.

3. The dielectric device according to claim 1,
   wherein the first conductor film is constituted by Ni, Cu, or Al or an alloy mainly composed of any thereof.

4. The dielectric device according to claim 1,
   wherein the additive contains an oxide of the element.

5. The dielectric device according to claim 1,
   further comprising a second conductor film provided on the dielectric film;
   wherein the first conductor film contains the additive, the element in the first conductor film having a concentration of 10 ppm to 5000 ppm when the element is Si and a concentration of 10 ppm to 3000 ppm when the element is Al, P, Mg, Mn, Y, V, Mo, Co, Nb, Fe, or Cr.

6. The dielectric device according to claim 1,
   wherein the first conductor film is constituted by Ni and contains the additive, the additive containing Si, Si in the first conductor film having a concentration of 10 ppm to 5000 ppm.

7. The dielectric device according to claim 1, wherein the dielectric film is an oxide.

8. The dielectric device according to claim 7,
   wherein the dielectric film has a perovskite structure and contains at least one element selected from the group consisting of Ba, Sr, Ca, Pb, Ti, Zr and Hf.

9. The dielectric device according to claim 1,
   wherein the first conductor film is a metal foil.

10. The dielectric device according to claim 1,
    further comprising a base for supporting the first conductor film and the dielectric film.

* * * * *